United States Patent
Loiseau et al.

(10) Patent No.: US 12,300,627 B1
(45) Date of Patent: May 13, 2025

(54) INTEGRATED CIRCUIT STRUCTURES HAVING A WATERMARK

(71) Applicant: GlobalFoundries U.S. Inc., Malta, NY (US)

(72) Inventors: Alain Loiseau, Williston, VT (US); Peter Coutu, Williston, VT (US); Romain Feuillette, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/750,377

(22) Filed: Jun. 21, 2024

(51) Int. Cl.
*H01L 23/544* (2006.01)
*H01L 23/522* (2006.01)
*H10D 89/10* (2025.01)

(52) U.S. Cl.
CPC ........ *H01L 23/544* (2013.01); *H01L 23/5226* (2013.01); *H10D 89/10* (2025.01); *H01L 2223/54433* (2013.01)

(58) Field of Classification Search
CPC ..................................... H01L 23/544
USPC ......................................... 716/119
See application file for complete search history.

(56) References Cited

U.S. PATENT DOCUMENTS

| 8,402,401 | B2 | 3/2013 | Chakraborty et al. | |
| 8,918,749 | B2* | 12/2014 | Kugel | G06F 30/39 |
| | | | | 716/110 |
| 9,819,950 | B2 | 11/2017 | Boles et al. | |
| 2004/0255258 | A1* | 12/2004 | Li | G06F 30/39 |
| | | | | 716/122 |
| 2024/0296268 | A1* | 9/2024 | Chang | G06F 30/31 |

* cited by examiner

*Primary Examiner* — Eric D Lee
(74) *Attorney, Agent, or Firm* — Thompson Hine LLP; Francois Pagette

(57) ABSTRACT

Structures for an integrated circuit having a watermark and related methods. The structure comprises a first semiconductor structure including at least one feature with a variation relative to a second semiconductor structure including the at least one feature without the variation. The variation provides a watermark for identifying a Process Design Kit used to form the first semiconductor structure.

8 Claims, 9 Drawing Sheets

INTEGRATED CIRCUIT STRUCTURES HAVING A WATERMARK

BACKGROUND

The present disclosure relates to semiconductor devices and integrated circuit fabrication and, more specifically, to structures for an integrated circuit having a watermark and related methods.

A Process Design Kit is a set of files used facilitate the design an integrated circuit. It contains the information and tools needed to successfully design an integrated circuit such as design manuals, layout rules, models. The Process Design Kit is created by a foundry and supplied to their customers, who use the process design kit in the design process. Conventional Process Design Kits lack any mechanism to trace their source. For example, a customer has the ability to use the process design kit supplied by a foundry to create the design of an integrated circuit, and then provide the design to a different foundry to manufacture the integrated circuit.

Improved structures for an integrated circuit having a watermark and related methods are needed.

SUMMARY

In an embodiment of the invention, a structure comprises a first semiconductor structure including at least one feature with a difference or variation relative to a second semiconductor structure including the at least one feature without the variation. The difference or variation provides a watermark for identifying a Process Design Kit used to form the first semiconductor structure.

In an embodiment of the invention, a method comprises forming a first semiconductor structure including at least one feature with a difference or variation relative to a second semiconductor structure including the at least one feature without the variation. The difference or variation provides a watermark for identifying a Process Design Kit used to form the first semiconductor structure.

In an embodiment of the invention, a method comprises providing a first Process Design Kit to a first foundry customer, and providing a second Process Design Kit to a second foundry customer. The first Process Design Kit includes a first semiconductor structure having at least one feature with a difference or variation relative to a second semiconductor structure including the at least one feature without the variation. The second Process Design Kit includes the second semiconductor structure. The difference or variation provides a watermark for identifying the first Process Design Kit used to form the first semiconductor structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
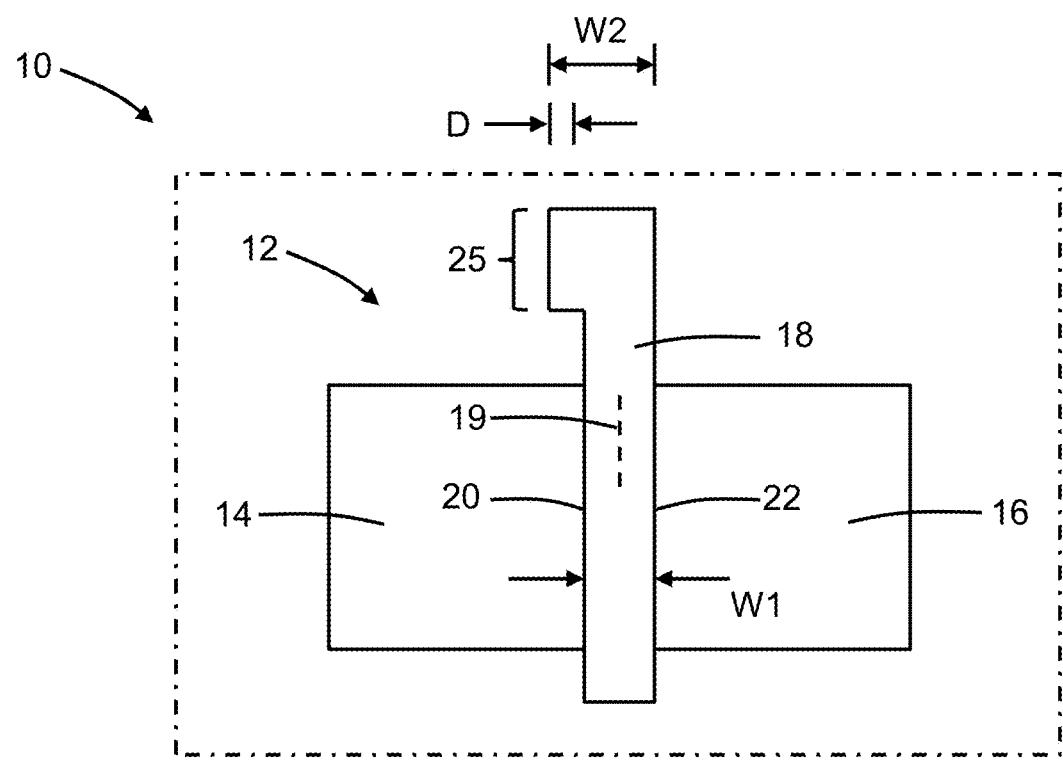
FIGS. 1, 1A, 1B are top views of structures in accordance with embodiments of the invention.
Figure 1A:
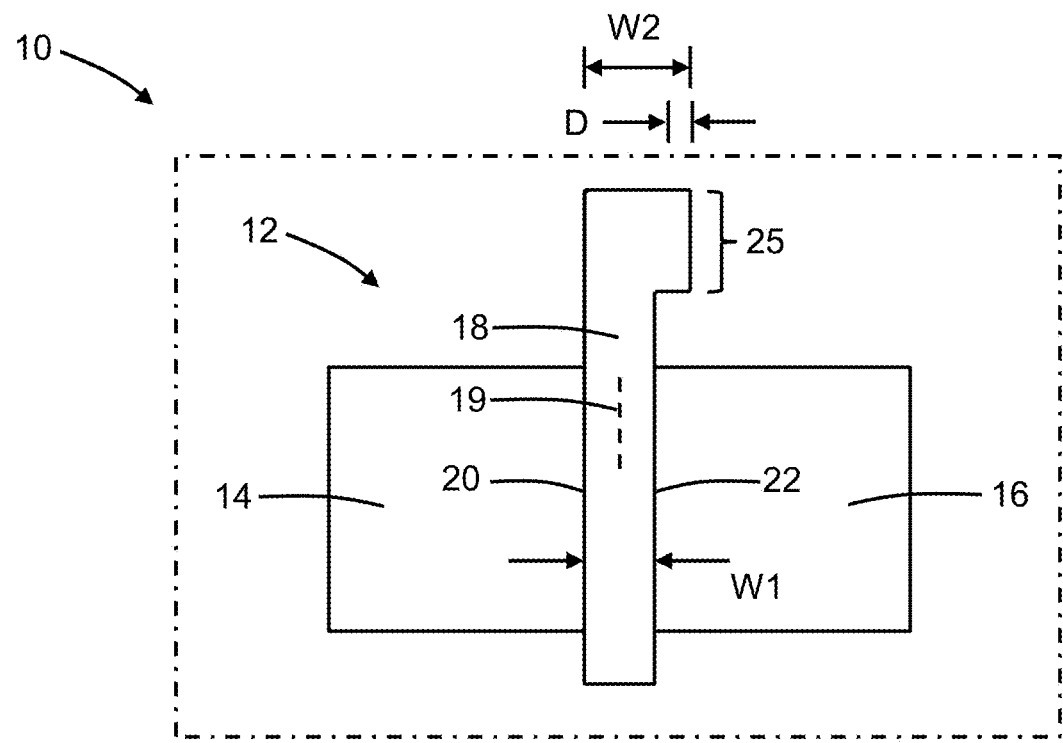
Figure 1B:
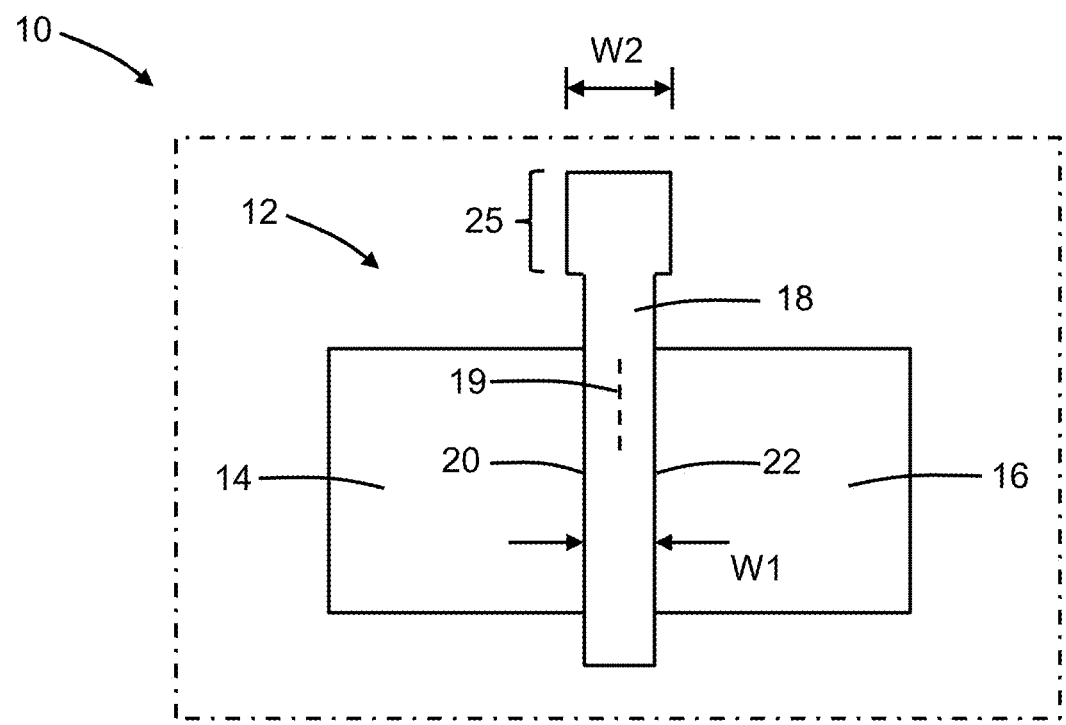

With reference to FIGS. 1, 1A, 1B and in accordance with embodiments of the invention, a structure 10 includes a transistor 12 having a source 14, a drain 16, and a gate 18 that is laterally positioned between the source 14 and the drain 16. The gate 18 has a sidewall 20 adjacent to the source 14 and an opposite sidewall 22 adjacent to the drain 16. The gate 18 is elongated with a length dimension and a width dimension W1 transverse to the length dimension. The gate 18 includes a pad 25 that is enlarged to promote the landing of one or more contacts (not shown) that are physically and electrically coupled to the gate 18. The pad 25 of the gate 18 has a width dimension W2 that is greater than the width dimension W1.

In an embodiment of the structure 10 as shown in FIG. 1, the pad 25 of the gate 18 may be laterally offset relative to a longitudinal axis 19 of the gate 18 such that a portion of the pad 25 projects as a gate extension outwardly from the sidewall 20 by a distance D in a direction toward the source 14. In an embodiment, the distance D may be equal to the difference between the width dimension W1 and the width dimension W2. The distance D of projection (e.g., the width difference) of the gate extension is greater than the critical dimension tolerance for the shape embodied by the pad 25. For example, the distance D of projection of the gate extension may be greater than or equal to about 10 nanometers.

In an embodiment of the structure 10 as shown in FIG. 1A, the pad 25 of the gate 18 may be laterally offset relative to the longitudinal axis 19 of the gate 18 such that a portion of the pad 25 projects as a gate extension outwardly from the sidewall 22 by a distance D in a direction toward the drain 16. In an embodiment, the distance D may be equal to the difference between the width dimension W1 and the width dimension W2. The distance D of projection (e.g., the width difference) of the gate extension is greater than the critical dimension tolerance for the shape embodied by the pad 25. For example, the distance D of projection of the gate extension may be greater than or equal to about 10 nanometers.

In an embodiment of the structure 10 as shown in FIG. 1B, the pad 25 of the gate 18 may be centered relative to the longitudinal axis 19 of the gate 18 such that a portion of the pad 25 projects by a distance outwardly from the sidewall 22 in a direction toward the source 14 and another portion of the pad 25 projects by another distance outwardly from the sidewall 22 in an opposite direction toward the drain 16. In an embodiment, the sum of the distances of projection may be equal to the difference between the width dimension W1 and the width dimension W2 and, therefore, the distance D. Both distances of projection (e.g., the width difference) are greater than the critical dimension tolerance for the shape embodied by the pad 25. For example, the sum of the distances of projection, which is equal to the distance D, may be greater than or equal to about 10 nanometers.

A Process Design Kit (PDK) may be deliberately configured with one or more parameterized cells (PCells) that can be implemented using design software to instantiate the transistor 12. The Process Design Kit is a library of basic components generated by a foundry to give open access to its generic process for fabrication of integrated circuits. A PCell provides a representation of an electronic component describing its physical structure inside an integrated circuit. Customized Process Design Kits may be distributed by a foundry to its customers with variations that provide watermarks for identifying the customers. In that regard, different customers may be provided with a customized version of the Process Design Kit that includes a PCell embodying the transistor 12 with a layout including the pad 25 of FIG. 1, a PCell embodying the transistor 12 with a layout including the pad 25 of FIG. 1A, and/or a PCell embodying the transistor 12 with a layout including the pad 25 of FIG. 1B. The variations in the layout for the transistor 12 incorporated into the different PCells may be embodied as physical differences between the transistors 12 that are fabricated using the different PCells, and the layout variations may not impact the footprint or the electrical performance of the transistor 12.

The Process Design Kit supplied to a particular customer may contain a PCell for the transistor 12 that is customized based on one or more parameters of the transistor 12. In an embodiment, the parameter may be transistor type in that, for example, the PCell for the transistor 12 of FIG. 1 may be used to fabricate n-type field-effect transistors, and the PCell for the transistor 12 of FIG. 1A may be used to fabricate p-type field-effect transistors. In an embodiment, the parameter may be transistor width in that the PCell for the transistor 12 of FIG. 1 may be used to fabricate transistors of a given transistor width, and the PCell for the transistor 12 of FIG. 1A may be used to fabricate transistors of a different transistor width. In an embodiment, the parameter may be the number of gate fingers in that the PCell for the transistor 12 of FIG. 1 may be used to fabricate transistors having a given number of gate fingers, and the PCell for the transistor 12 of FIG. 1A may be used to fabricate transistors having a different number of gate fingers.

The different PCells selected for a specific customized Process Design Kit may provide a watermark that can be used to link a foundry customer to the Process Design Kit and identify an origin or source of the Process Design Kit used to fabricate an integrated circuit. An inspection of the transistors 12 fabricated using the Process Design Kit by metrology, such as by electron microscopy, may be used to identify and trace the foundry customer supplied with the specific watermarked Process Design Kit. For example, the inspection may determine that the customer received a Process Design Kit from a foundry identifiable by the watermark and supplied an integrated circuit design prepared using the Process Design Kit to a different foundry for fabricating an integrated circuit.

Figure 2:
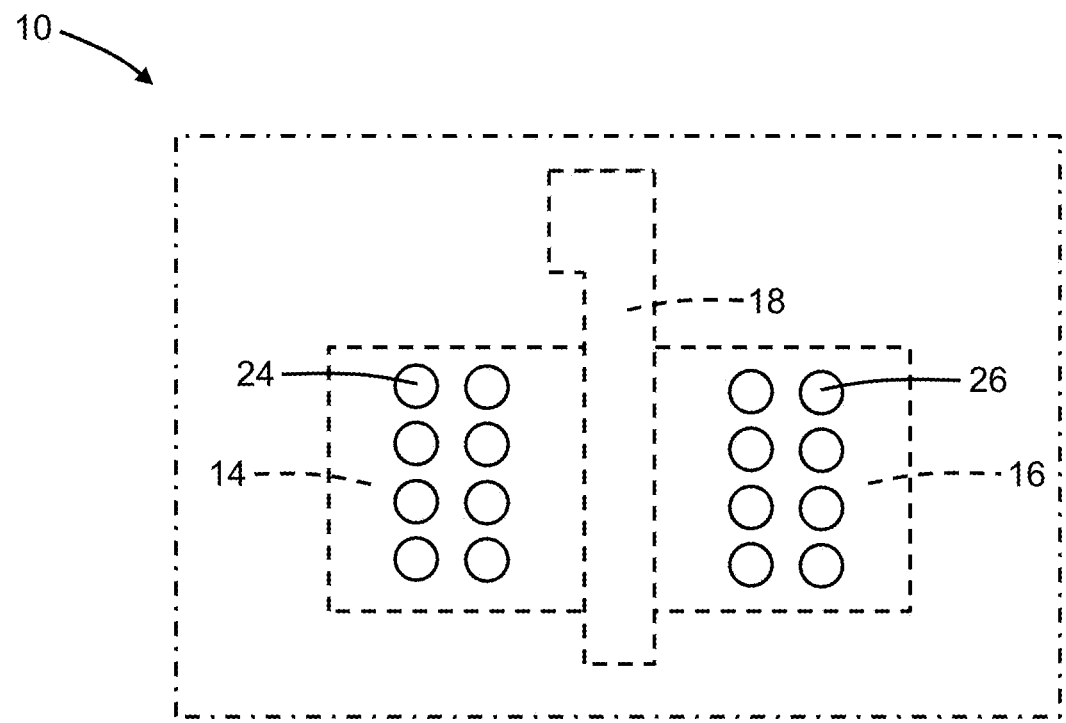
FIGS. 2, 2A are top views of structures in accordance with embodiments of the invention.
Figure 2A:
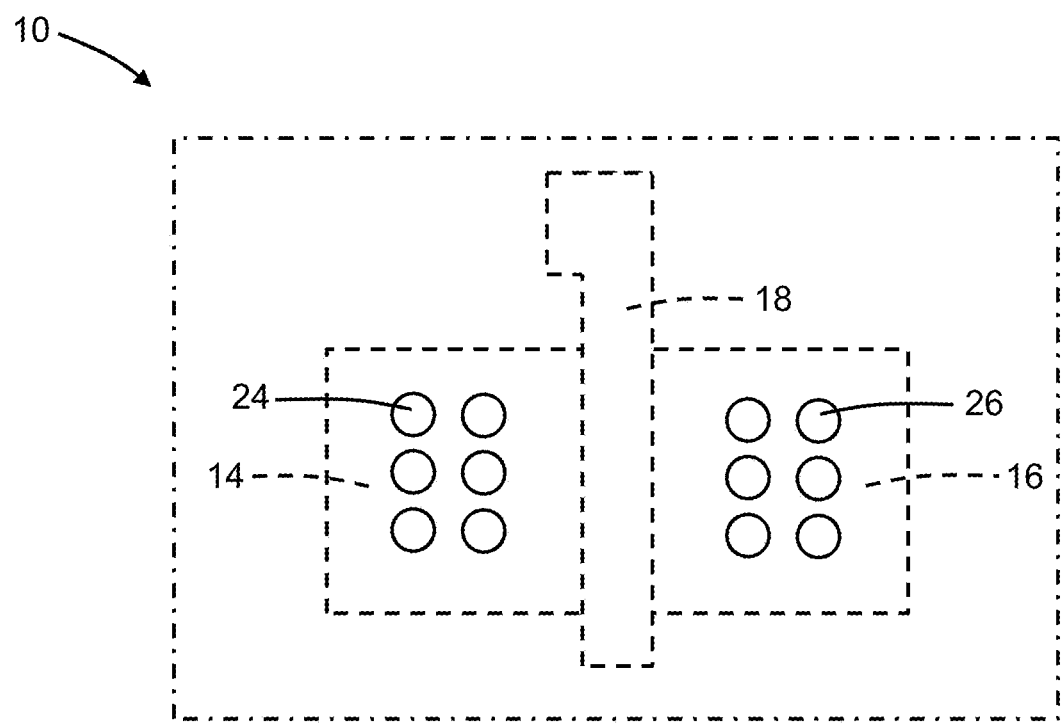

With reference to FIGS. 2, 2A and in accordance with embodiments of the invention, the structure 10 may further include contacts 24 that are placed on the source 14 of the transistor 12 and contacts 26 that are placed on the drain 16 of the transistor 12. The contacts 24 may be physically and electrically coupled to the source 14. The contacts 26 may be physically and electrically coupled to the drain 16. The contacts 24, 26 may be included in a middle-of-line stack that is fabricated by middle-of-line processing, and the contacts 24, 26 may be formed in a dielectric layer deposited over the transistor 12.

In an embodiment, the number of contacts 24 placed on the source 14 of the structure 10 of FIG. 2A may be less than the number of contacts 24 placed on the source 14 of the structure 10 of FIG. 2 to provide a numerical difference as the physical variation between the structure 10 of FIG. 2A and the structure 10 of FIG. 2. In an embodiment, the number of contacts 26 placed on the drain 16 of the structure 10 of FIG. 2A may be less than the number of contacts 26 placed on the drain 16 of the structure 10 of FIG. 2 to provide a numerical difference as the physical variation between the structure 10 of FIG. 2A and the structure 10 of FIG. 2. In an embodiment, the number of contacts 24 placed on the source 14 of the structure 10 of FIG. 2A may be less than the number of contacts 24 placed on the source 14 of the structure 10 of FIG. 2 and the number of contacts 26 placed on the drain 16 of the structure 10 of FIG. 2A may be less than the number contacts 26 placed on the drain 16 of the structure 10 of FIG. 2 to provide numerical differences as the physical variation between the structure 10 of FIG. 2A and the structure 10 of FIG. 2. A difference in the number of contacts 24 and/or a difference in the number of contacts 26 may provide a watermark as a physical variation that can be used to identify versions of a Process Design Kit provided by a foundry to different customers.

Figure 3:
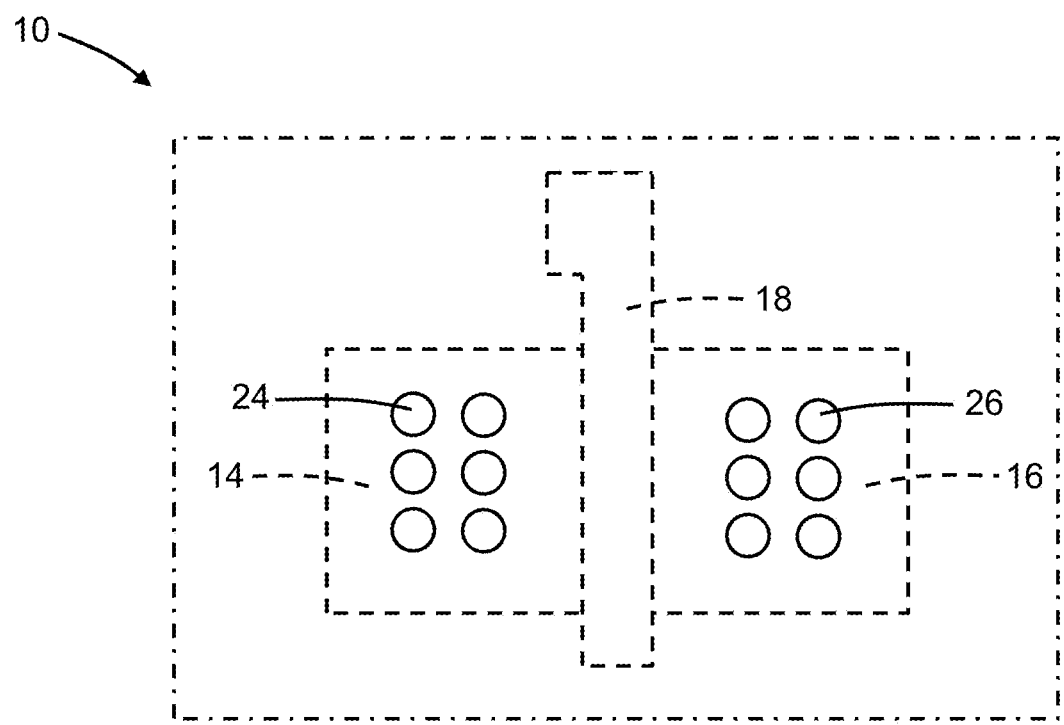
FIGS. 3, 3A are top views of structures in accordance with embodiments of the invention.
Figure 3A:
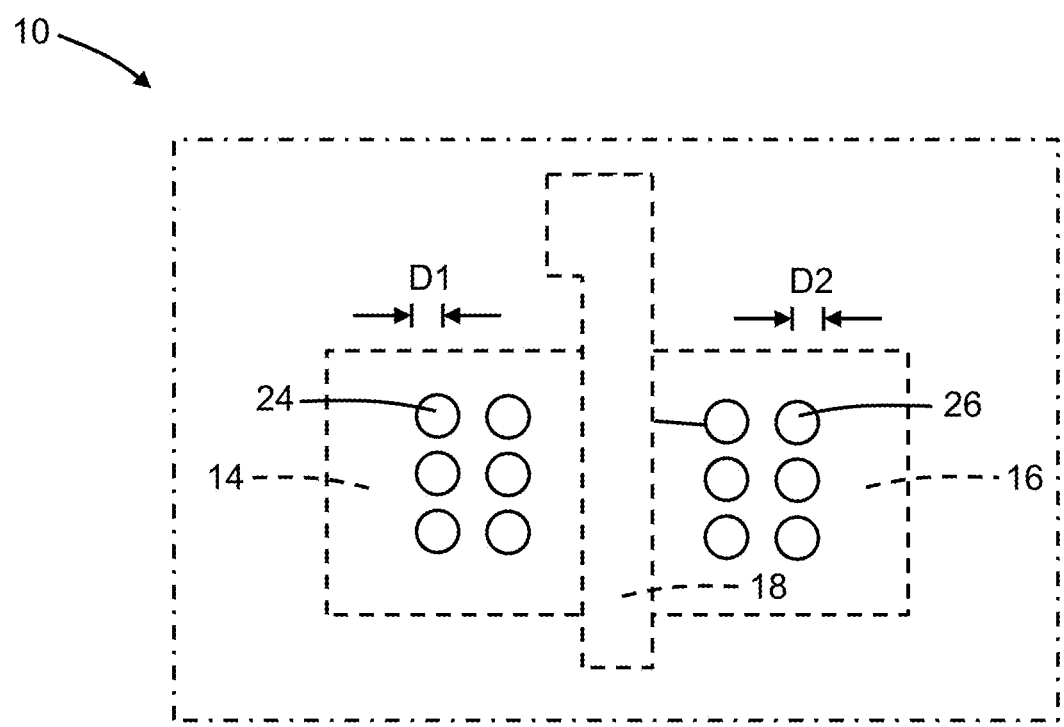

With reference to FIGS. 3, 3A and in accordance with embodiments of the invention, the contacts 24 may land on the source 14 with a different placement in FIG. 3 than in FIG. 3A and/or the contacts 26 may land on the drain 16 with a different placement in FIG. 3 than in FIG. 3A to provide one or more differences representing the variation between the structure 10 of FIG. 3A and the structure of FIG. 3. In an embodiment, the contacts 24 in FIG. 3A may be shifted laterally by a distance D1 to land closer to the gate 18 in comparison with the contacts 24 in FIG. 3. In an embodiment, the contacts 26 in FIG. 3A may be shifted laterally by a distance D2 to land closer to the gate 18 in comparison with the contacts 26 in FIG. 3. In an embodiment, the contacts 24 in FIG. 3A may be shifted laterally by a distance D1 to land closer to the gate 18 in comparison with the contacts 24 in FIG. 3, and the contacts 26 in FIG. 3A may be shifted laterally by a distance D2 to land closer to the gate 18 in comparison with the contacts 26 in FIG. 3. Distance D1 and distance D2 are greater than the critical dimension tolerance for the shapes embodied by the contacts 24, 26. For example, each of the distances D1, D2 may be greater than or equal to about 10 nanometers. The difference in the distance D1 and/or the difference in the distance D2 may provide a watermark that can be used to identify Process Design Kits provided by a foundry to different customers.

Figure 4:
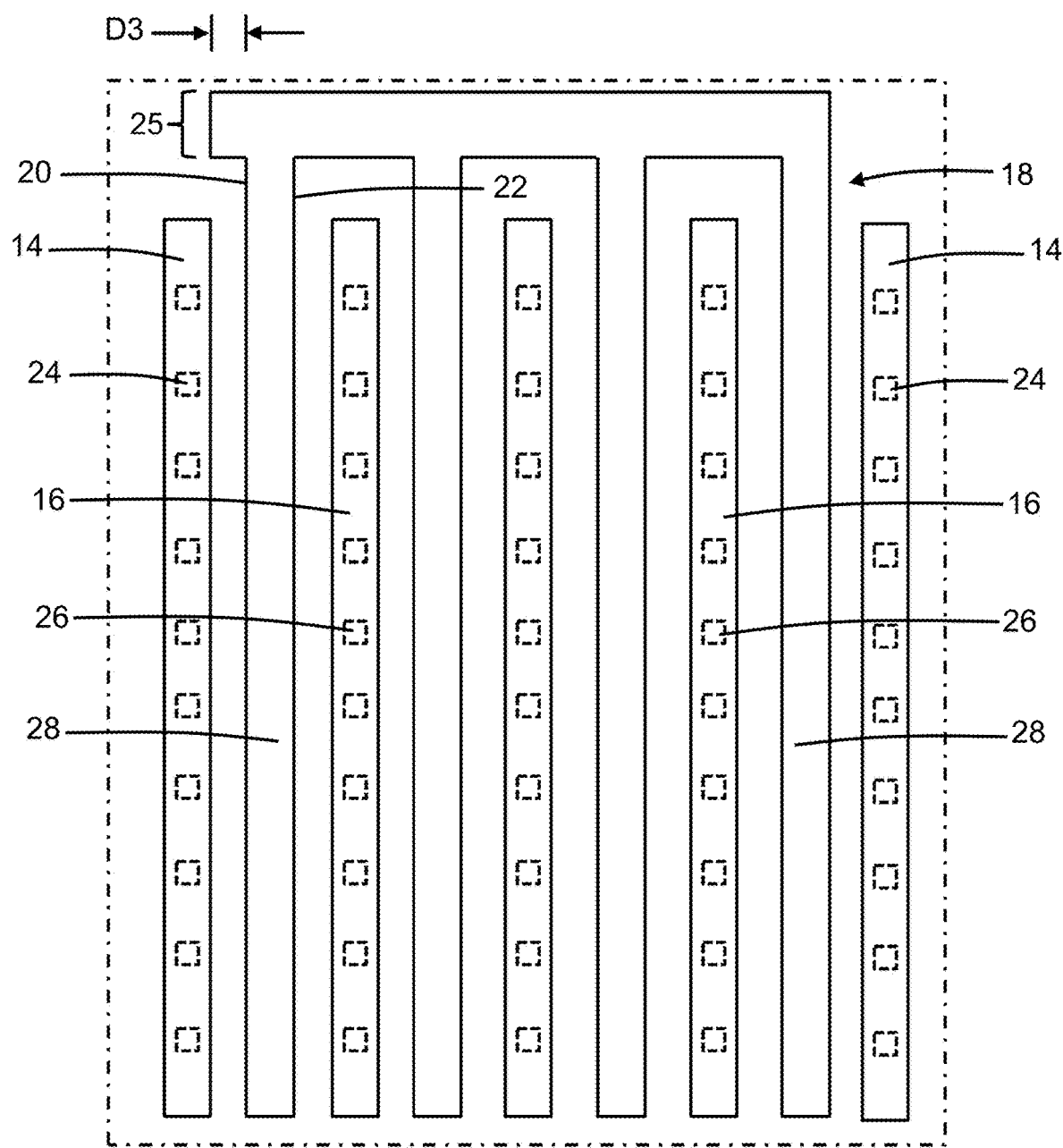
FIGS. 4, 4A are top views of structures in accordance with embodiments of the invention.
Figure 4A:
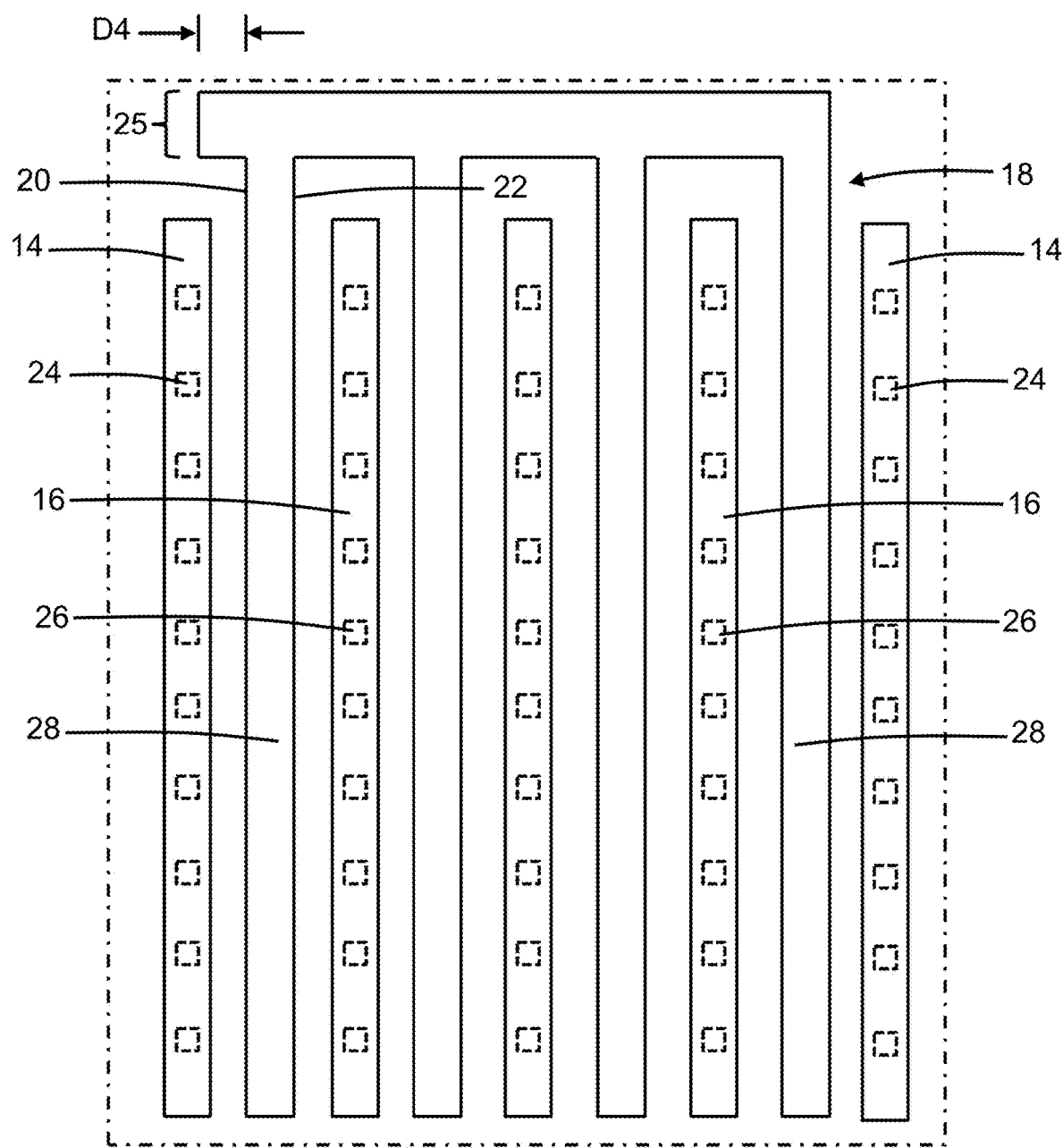

With reference to FIGS. 4, 4A and in accordance with embodiments of the invention, the gate 18 of the structure 10 may include multiple gate fingers 28 that are connected at one end to the pad 25, as well as multiple sources 14 and multiple drains 16. For example, the structure 10 may be configured as a switch field-effect transistor that includes the multiple gate fingers 28. Contacts 24 may be formed that land on each source 14, and contacts 26 may be formed that land on each drain 16. The pad 25 may provide a gate extension that projects outwardly from the sidewall 20 of the nearest gate finger 28 by a distance D3 for the structure 10 of FIG. 4, and the pad 25 may have a gate extension that projects outwardly from the sidewall 20 of the nearest gate finger 28 by a distance D4 for the structure 10 of FIG. 4A. The distance D4 of projection of the gate extension of FIG.

4A may be greater than the distance D3 of projection of the gate extension of FIG. 4 to provide a physical difference representing the variation between the structure 10 of FIG. 4A and the structure of FIG. 4. The difference between the distance D3 of projection of the gate extension of FIG. 4 and the distance D4 of projection of the gate extension of FIG. 4A is greater than the critical dimension tolerance for the shape embodied by the pad 25. The difference between the distance D3 and the distance D4 may provide watermarks that can be used to identify Process Design Kits provided by a foundry to different customers.

Figure 5:
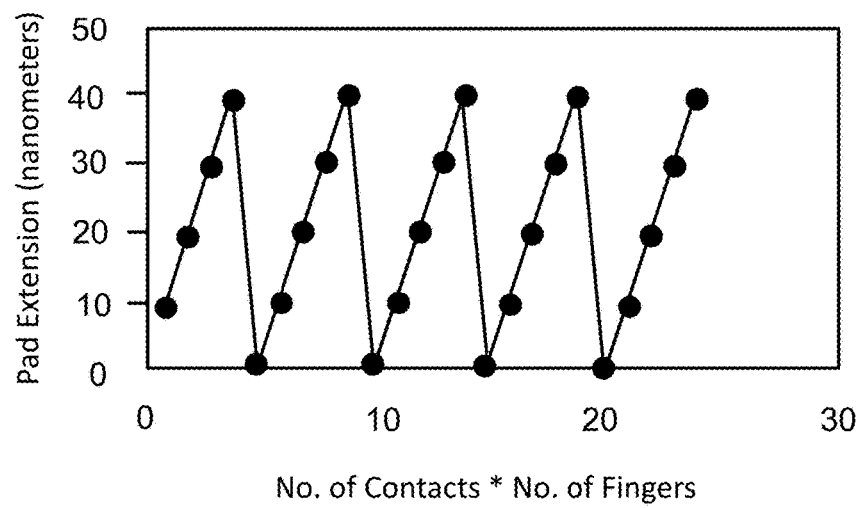
FIG. 5 is a graph showing a systematic difference or variation for providing a watermark in accordance with embodiments of the invention.

With reference to FIG. 5 and in accordance with embodiments of the invention, the distance of projection of the gate extension for different instances of the transistor 12 may be determined based on a formula to provide the difference representing the variation in the instances of the fabricated transistor 12. For example, the distance D3 (FIG. 4) of projection and the distance D4 (FIG. 4A) of projection may be selected by a formula that is based on parameters governing the different structures 10. In an embodiment, the distance D3 of projection, the distance D4 of projection, and other similar distances for gate extensions may be determined by a formula that is based on the number of contacts 24, 26 and the number of gate fingers 28 included in different instances of the transistor 12 shown in FIGS. 4, 4A. For example, the formula may multiply a projection distance of 10 nanometers by (the product of the number of contacts 24, 26 and the number of gate fingers 28) modulo 5. As the number of contacts 24, 26 and the number of gate fingers 28 vary for different instances of the structure 10, the projection distance for the gate extension varies according to the formula to supply a watermark.

In an embodiment, different foundry customers may receive different Process Design Kits in which different formulas are used to determine the projection distance. The variations in the projection distances according to the different formulas provide unique watermarks that can be used to identify the Process Design Kit supplied to each foundry customer.

Figure 6:
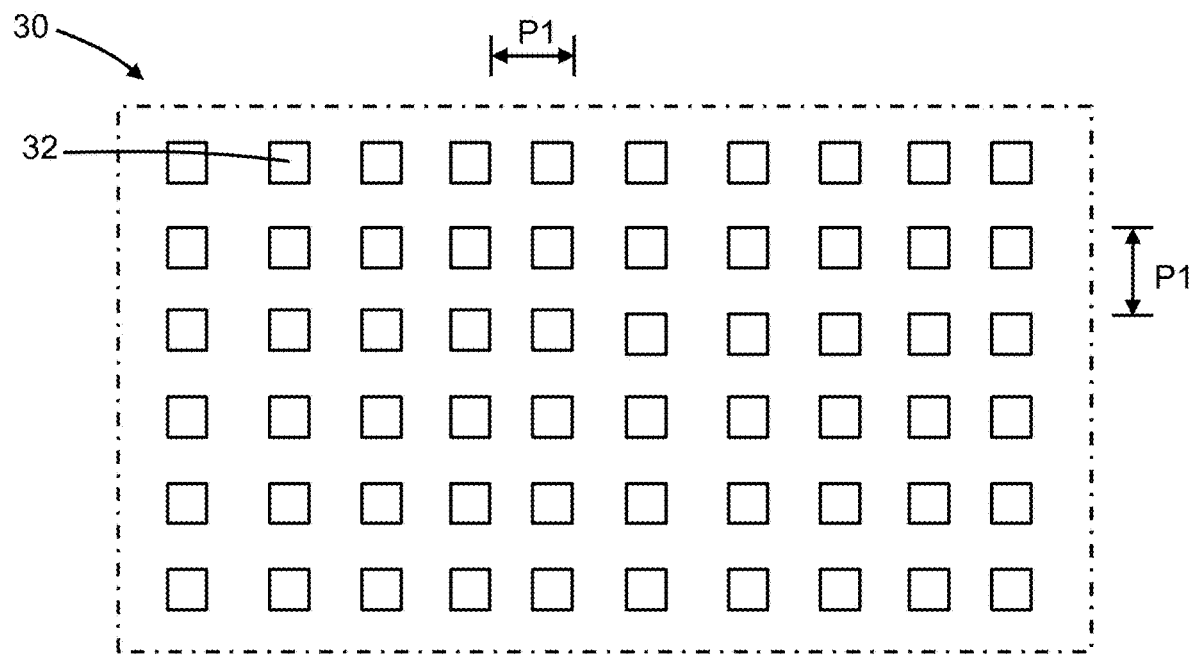
FIGS. 6, 6A are top views of structures in accordance with embodiments of the invention.
Figure 6A:
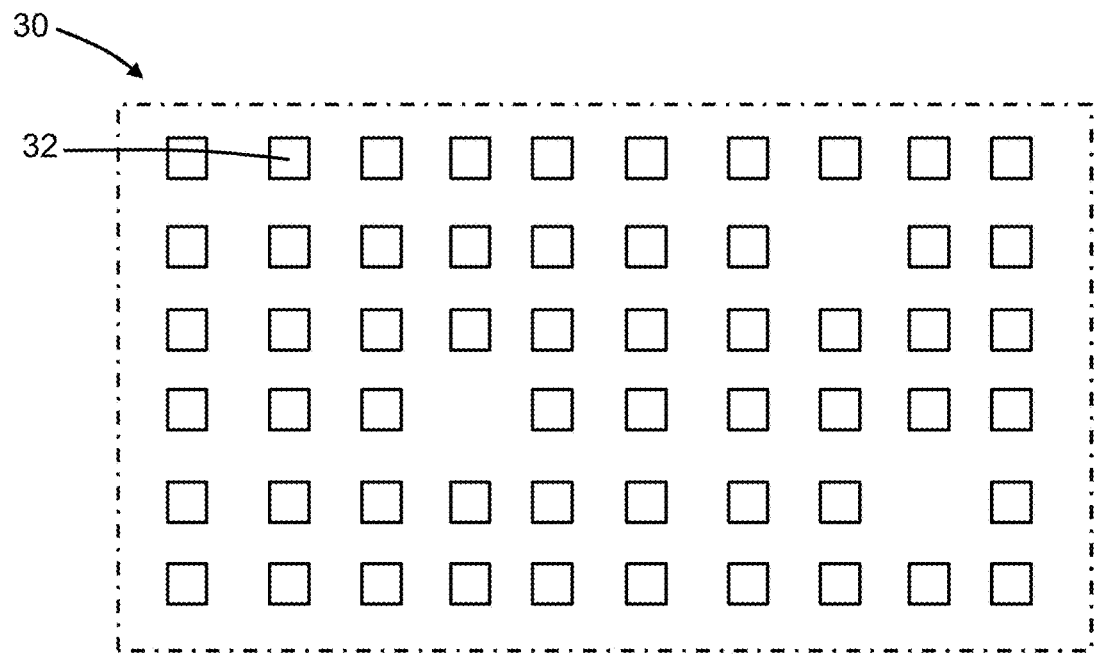

With reference to FIGS. 6, 6A and in accordance with embodiments of the invention, the watermark may be embodied in a structure 30 for a via array that includes vias 32 that are arranged in rows and columns of the via array. The via array may be implemented as a PCell having a row parameter and a column parameter that specify the number of rows and the number of columns of vias 32 in the array, as well as other parameters that determine the width and length dimension of the area to be filled by the vias 32. The rows and columns of vias 32 in the via array may be characterized by a uniform pitch P1. The via array may be included in a back-end-of-line stack that is fabricated by back-end-of-line processing.

The structure 30 of FIG. 6A may include several locations in the rows and columns of via array at which certain vias 32 are deliberately not placed and are therefore missing from the via array that is fabricated. The structure 30 for the fabricated via array of FIG. 6A is distinguishable from the structure 30 for the fabricated via array of FIG. 6 to provides a unique watermark, which is represented by the missing vias, that can be used to identify the Process Design Kit including the PCell for the via array used by different foundry customers to instantiate the via arrays in a design.

Figure 7:
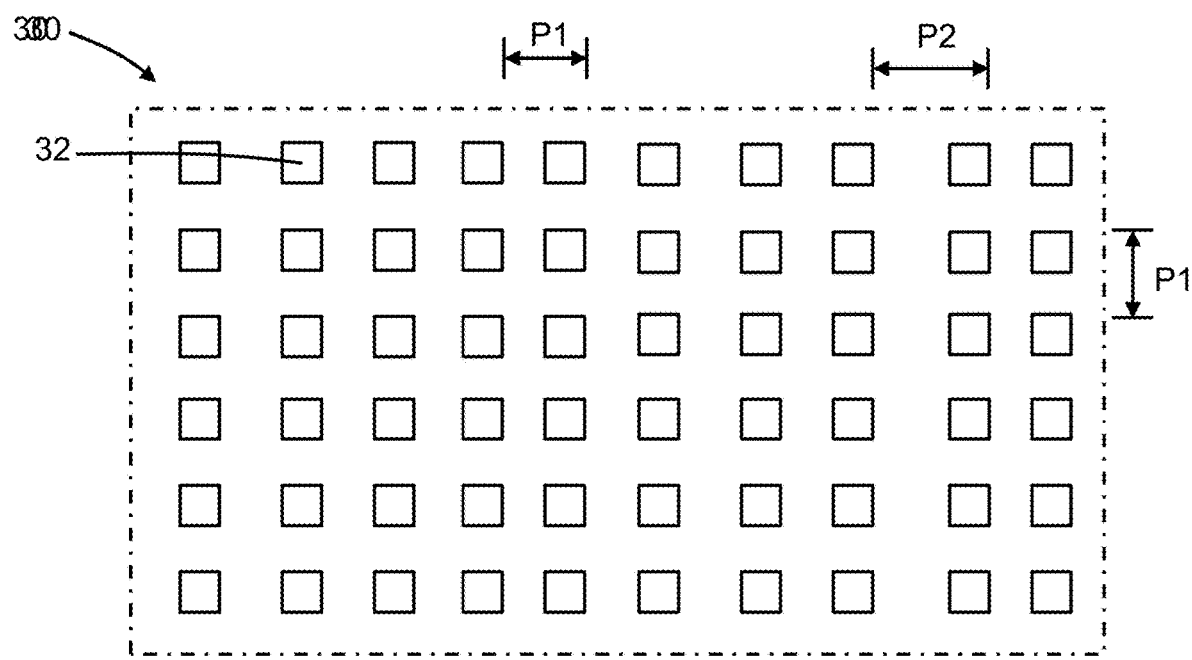
FIG. 7 is a top view of a structure in accordance with embodiments of the invention.

With reference to FIG. 7 and in accordance with embodiments of the invention, the structure 30 may be modified to include a pair of columns of vias 32 that are characterized by a pitch P2 that is greater than the pitch P1 of the other columns of vias 32 in the structure 30 of FIG. 6. The difference between the pitch P1 and the pitch P2 provides a variation representing a unique watermark that can be used to identify the Process Design Kit including the PCell with the via array that includes the vias 32 in adjacent columns characterized by the pitch P2 that is different from the pitch P1 of the other columns. The structure 30 for the fabricated via array of FIG. 7 is distinguishable from the structure 30 for the fabricated via array of FIG. 6 to provides a unique watermark that can be used to identify the Process Design Kit including the PCell for the via array used by different foundry customers to instantiate the via arrays in a design.

Figure 8:
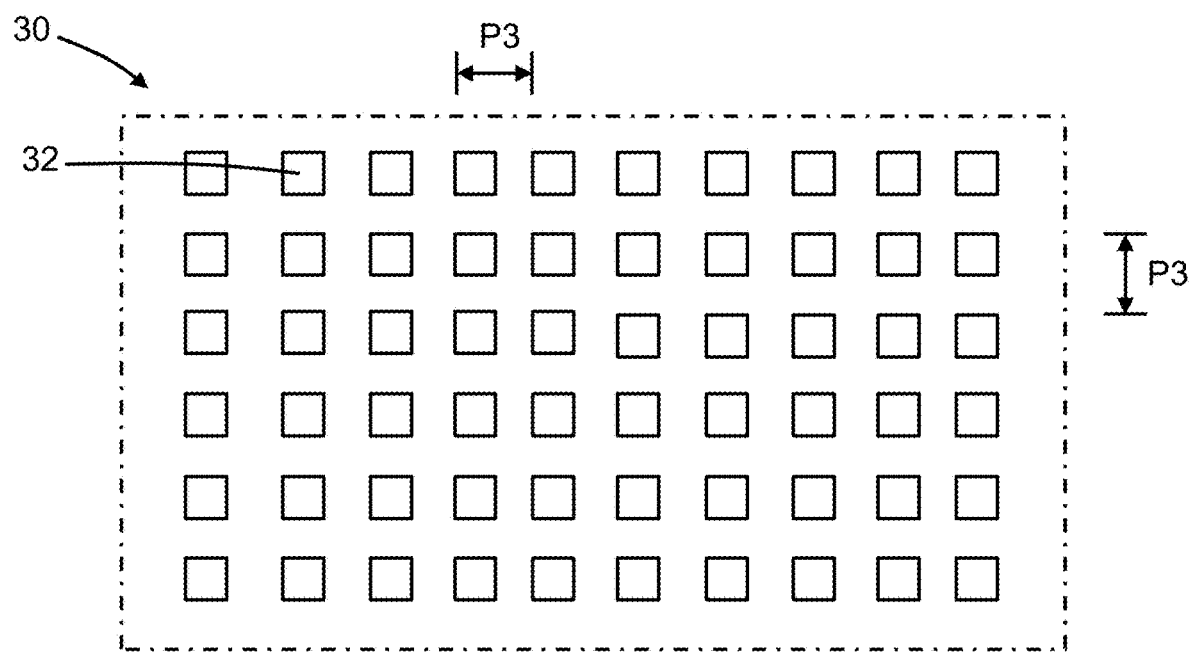
FIG. 8 is a top view of a structure in accordance with embodiments of the invention.

With reference to FIG. 8 and in accordance with embodiments of the invention, the structure 30 may be modified to change the pitch of the vias 32 in all rows and/or all columns of the via array. In an embodiment, the pitch P3 of the vias 32 in the structure 30 of FIG. 8 may be less than the pitch P1 of the vias 32 in the structure 30 of FIG. 6. The difference between the pitch P1 and the pitch P3 provides a variation representing a unique watermark that can be used to identify the Process Design Kit including the PCell with the via array that includes either the via array of FIG. 6 or the via array of FIG. 8.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first field-effect transistor including a first source, a first drain, and a first gate, the first gate having a first gate pad and a first longitudinal axis; and
a second field-effect transistor including a second source, a second drain, and a second gate having a second gate pad and a second longitudinal axis,
wherein the first gate pad is laterally offset relative to the first longitudinal axis in a first direction toward the first source, the second gate pad is laterally offset relative to the second longitudinal axis in a second direction toward the second drain to provide a physical variation between the first field-effect transistor and the second field-effect transistor, the physical variation is greater than a critical dimension tolerance for the first gate pad and the second gate pad, and the physical variation provides a watermark for identifying a Process Design Kit used to form the first field-effect transistor and the second field-effect transistor.

2. The structure of claim 1 wherein the first field-effect transistor is mapped to a first parameterized cell of the Process Design Kit, and the second field-effect transistor is mapped to a second parameterized cell of the Process Design Kit.

3. The structure of claim 1 wherein the first gate includes a sidewall, and the first gate pad includes an extension that projects outwardly from the sidewall of the first gate by a first distance toward the first source.

4. The structure of claim 3 wherein the first distance is greater than or equal to about 10 nanometers.

5. The structure of claim 3 wherein the second gate includes a sidewall, and the second gate pad includes an extension that projects outwardly from the sidewall of the second gate by a second distance toward the second drain.

6. The structure of claim 5 wherein the first distance is greater than or equal to about 10 nanometers, and the second distance is greater than or equal to about 10 nanometers.

7. The structure of claim 5 wherein a sum of the first distance and the second distance is greater than or equal to about 10 nanometers.

8. The structure of claim 5 wherein the first distance and the second distance are selected based on a formula.

\* \* \* \* \*